(12) United States Patent
Gohara et al.

(10) Patent No.: US 10,468,333 B2
(45) Date of Patent: Nov. 5, 2019

(54) COOLING APPARATUS, SEMICONDUCTOR MODULE, AND VEHICLE

(71) Applicant: FUJI ELECTRIC CO., LTD., Kanagawa (JP)

(72) Inventors: Hiromichi Gohara, Matsumoto (JP); Takafumi Yamada, Matsumoto (JP); Yuta Tamai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/258,650

(22) Filed: Jan. 27, 2019

(65) Prior Publication Data

US 2019/0279917 A1    Sep. 12, 2019

(30) Foreign Application Priority Data

Mar. 6, 2018    (JP) ................................. 2018-040257

(51) Int. Cl.
| | |
|---|---|
| H01L 23/473 | (2006.01) |
| H05K 7/20 | (2006.01) |
| H01L 25/07 | (2006.01) |
| H01L 23/427 | (2006.01) |
| F28F 3/02 | (2006.01) |

(52) U.S. Cl.
CPC .......... *H01L 23/473* (2013.01); *F28F 3/025* (2013.01); *H01L 23/427* (2013.01); *H01L 25/07* (2013.01); *H05K 7/20927* (2013.01)

(58) Field of Classification Search
CPC .......................... H01L 23/473; H05K 7/20927
See application file for complete search history.

(56) References Cited

U.S. PATENT DOCUMENTS

| | | | | |
|---|---|---|---|---|
| 4,644,385 | A * | 2/1987 | Nakanishi | ........... H01L 23/4332 165/80.4 |
| 6,313,990 | B1 * | 11/2001 | Cheon | ..................... G06F 1/181 165/104.33 |
| 7,472,743 | B2 * | 1/2009 | Liu | ........................... G06F 1/20 165/104.33 |

(Continued)

FOREIGN PATENT DOCUMENTS

| | | |
|---|---|---|
| JP | 2006324647 A | 11/2006 |
| JP | 2014179563 A | 9/2014 |

(Continued)

*Primary Examiner* — Hung V Ngo

(57) ABSTRACT

A cooling apparatus for a semiconductor module including a semiconductor chip is provided, including; a ceiling plate having a lower surface; a casing portion having a coolant circulation portion and an outer edge portion surrounding the coolant circulation portion, the coolant circulation portion being arranged to face the lower surface of the ceiling plate, and the casing portion being closely attached, directly or indirectly, to a lower surface of the ceiling plate at the outer edge portion; and a cooling fin arranged in the coolant circulation portion, where the ceiling plate and the casing portion have a fastening portion in which the ceiling plate and the outer edge portion are stacked, and the fastening portion fastens the ceiling plate and the casing portion to an external device, and the cooling apparatus further includes a reinforcing member provided between the ceiling plate and the casing portion at the fastening portion.

15 Claims, 12 Drawing Sheets

(56) References Cited

U.S. PATENT DOCUMENTS

| | | | | |
|---|---|---|---|---|
| 7,968,925 B2* | 6/2011 | Tokuyama | ............ | H01L 23/473 |
| | | | | 257/299 |
| 9,478,477 B2* | 10/2016 | Iizuka | .................... | H01L 23/367 |
| 9,730,365 B2* | 8/2017 | Mari Curbelo | ....... | H01L 23/427 |
| 9,820,414 B2* | 11/2017 | You | ..................... | H05K 7/20927 |
| 9,831,799 B2* | 11/2017 | Shinohara | .......... | H05K 7/20927 |

FOREIGN PATENT DOCUMENTS

| | | | |
|---|---|---|---|
| JP | 2015220382 A | 12/2015 | |
| WO | 2016204257 A1 | 12/2016 | |

\* cited by examiner

COOLING APPARATUS, SEMICONDUCTOR MODULE, AND VEHICLE

The contents of the following Japanese patent application(s) are incorporated herein by reference:
2018-040257 filed in JP on Mar. 6, 2018.

BACKGROUND

1. Technical Field

The present invention relates to a cooling apparatus, a semiconductor module, and a vehicle.

2. Related Art

In the prior art, a configuration with a cooling apparatus being provided in a semiconductor module including semiconductor elements such as a power semiconductor chip is known (see Patent Documents 1-4, for example).

Patent Document 1: Japanese Patent Application Publication No. 2015-220382
Patent Document 2: Japanese Patent Application Publication No.: 2006-324647
Patent Document 3: WO 2016/204257
Patent Document 4: Japanese Patent Application Publication No. 2014-179563

SUMMARY

When the temperature of the cooling apparatus is changed due to change in the environmental temperature, heat generated by the semiconductor device, or the like, stresses are undesirably applied to a fastening part fastening the cooling apparatus to an external device or the like.

To solve the above-described problem, according to the first aspect of the present invention, provided is a cooling apparatus for a semiconductor module including a semiconductor chip. The cooling apparatus may include a ceiling plate having a lower surface. The cooling apparatus may include a casing portion having a coolant circulation portion and an outer edge portion surrounding the coolant circulation portion, where the coolant circulation portion is arranged to face the lower surface of the ceiling plate, and the casing portion is closely attached, directly or indirectly, to the lower surface of the ceiling plate at the outer edge portion. The cooling apparatus may include a cooling fin arranged in the coolant circulation portion. The ceiling plate and the casing portion may have a fastening portion in which the ceiling plate and the outer edge portion are stacked, and the fastening portion fastens the ceiling plate and the casing portion to an external device. The cooling apparatus may include a reinforcing member provided between the ceiling plate and the outer edge portion at the fastening portion.

The fastening portion may protrude toward an outside of a perimeter of the ceiling plate at the perimeter.

The ceiling plate may have two sets of facing sides and four corners when viewed from above. The fastening portion may be provided so as to protrude toward the outside of the perimeter of the ceiling plate at at least one of the corners. The casing portion may include a base plate having four corners, where the coolant circulation portion is arranged between the base plate and the lower surface of the ceiling plate, and an opening connecting the coolant circulation portion with an outside is provided at at least one of the corners of the base plate. The corner of the ceiling plate at which the fastening portion is provided and the corner of the base plate at which the opening is provided may be positioned to face each other.

The ceiling plate may have a set of facing long sides and a set of facing short sides when viewed from above. The fastening portion may be provided at both of a first corner at which the opening is provided and a second corner at which the opening is not provided. A first fastening portion at the first corner may be provided so as to protrude in a direction parallel to the long sides. A second fastening portion at the second corner may be provided so as to protrude in a direction different from the direction in which the first fastening portion protrudes.

A plurality of reinforcing members, including the reinforcing member, may be provided in a stacked manner in the fastening portion.

The ceiling plate may have a side surface along the perimeter. The reinforcing member may have an inner-side surface facing the coolant circulation portion and an outer-side surface opposite to the inner-side surface. The outer-side surface of the reinforcing member may be arranged so as to be flush with the side surface of the ceiling plate.

The reinforcing member may be formed of a material having higher proof stress than those of the ceiling plate and the casing portion.

A thickness of the casing portion at a position facing a center of the lower surface of the ceiling plate may be the same as a thickness of the casing portion at the fastening portion.

The reinforcing member, the ceiling plate, and the casing portion may have the same thickness at the fastening portion.

A cooling apparatus according to a another example of the first aspect may include a ceiling plate having an upper surface, on which the semiconductor chip is to be mounted, and a lower surface opposite to the upper surface. The cooling apparatus may include a reinforcing member arranged along a perimeter of the lower surface of the ceiling plate. The cooling apparatus may include a casing portion including a coolant circulation portion, where the coolant circulation portion is arranged to face the lower surface of the ceiling plate. The cooling apparatus may include a cooling fin arranged in the coolant circulation portion. The cooling apparatus may include a fastening portion. The casing portion may have a frame portion, a base plate, and a sidewall. The frame portion may have an upper surface and a lower surface opposite to the upper surface, and the upper surface of the frame portion may be closely attached, directly or indirectly, to the lower surface of the ceiling plate. The base plate may have a corner and an opening provided at the corner, and a coolant circulation portion may be arranged between the base plate and the lower surface of the ceiling plate. The sidewall may connect an inner-side surface of the frame portion and a periphery of the base plate and define the coolant circulation portion between the ceiling plate and the base plate. The fastening portion may be provided so as to protrude, at the perimeter of the ceiling plate, toward an outside away from the opening and the corner of the base plate, the frame portion, the reinforcing member, and the ceiling plate may be stacked in this order in the fastening portion, and the fastening portion may have a through hole penetrating the frame portion, the reinforcing member, and the ceiling plate.

A pipe is connected to the opening of the base plate of the casing portion, and the pipe may protrude away from the cooling fin.

The reinforcing member may be provided between the ceiling plate and the casing portion surrounding the coolant circulation portion on the lower surface of the ceiling plate.

The reinforcing member may be provided so as to extend to an inside of the coolant circulation portion.

When viewed from above, a length by which the reinforcing member protrudes into the inside of the coolant circulation portion in a region facing the opening may be longer than a length by which the reinforcing member protrudes into the inside of the coolant circulation portion in a region facing the cooling fin.

According to the second aspect of the present invention, provided is a cooling apparatus for a semiconductor module including a semiconductor chip. The cooling apparatus may include a ceiling plate having an upper surface, on which the semiconductor chip is to be mounted, and a lower surface opposite to the upper surface. The cooling apparatus may include a reinforcing member arranged along a perimeter of the lower surface of the ceiling plate. The cooling apparatus may include a casing portion arranged so as to have a coolant circulation portion between the ceiling plate and the casing portion. The cooling apparatus may include cooling fins arranged in the coolant circulation portion. The cooling apparatus may include a fastening portion. The casing portion may have a frame portion having an upper surface and a lower surface opposite to the upper surface, and the upper surface of the frame portion may be closely attached, directly or indirectly, to the lower surface of the ceiling plate. The casing portion may have a base plate that is arranged so as to have the coolant circulation portion between the base plate and the lower surface of the ceiling plate, and that has a corner and an opening provided on the corner. The casing portion may have a sidewall connecting an inner-side surface of the frame portion and a periphery of the base plate and defining the coolant circulation portion between the ceiling plate and the base plate. The fastening portion may be provided so as to protrude, at the perimeter of the ceiling plate, toward an outside away from the opening and the corner of the base plate, the frame portion, the reinforcing member, and the ceiling plate may be stacked in this order in the fastening portion, and the fastening portion may have a through hole penetrating the frame portion, the reinforcing member, and the ceiling plate.

A pipe is connected to the opening of the base plate of the casing portion, and the pipe may protrude away from the cooling fins.

According to the third aspect of the present invention, provided is a semiconductor module including a cooling apparatus according to the first or second aspect and a semiconductor device placed above the ceiling plate.

According to the fourth aspect of the present invention, provided is a vehicle including a semiconductor module according to the third aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
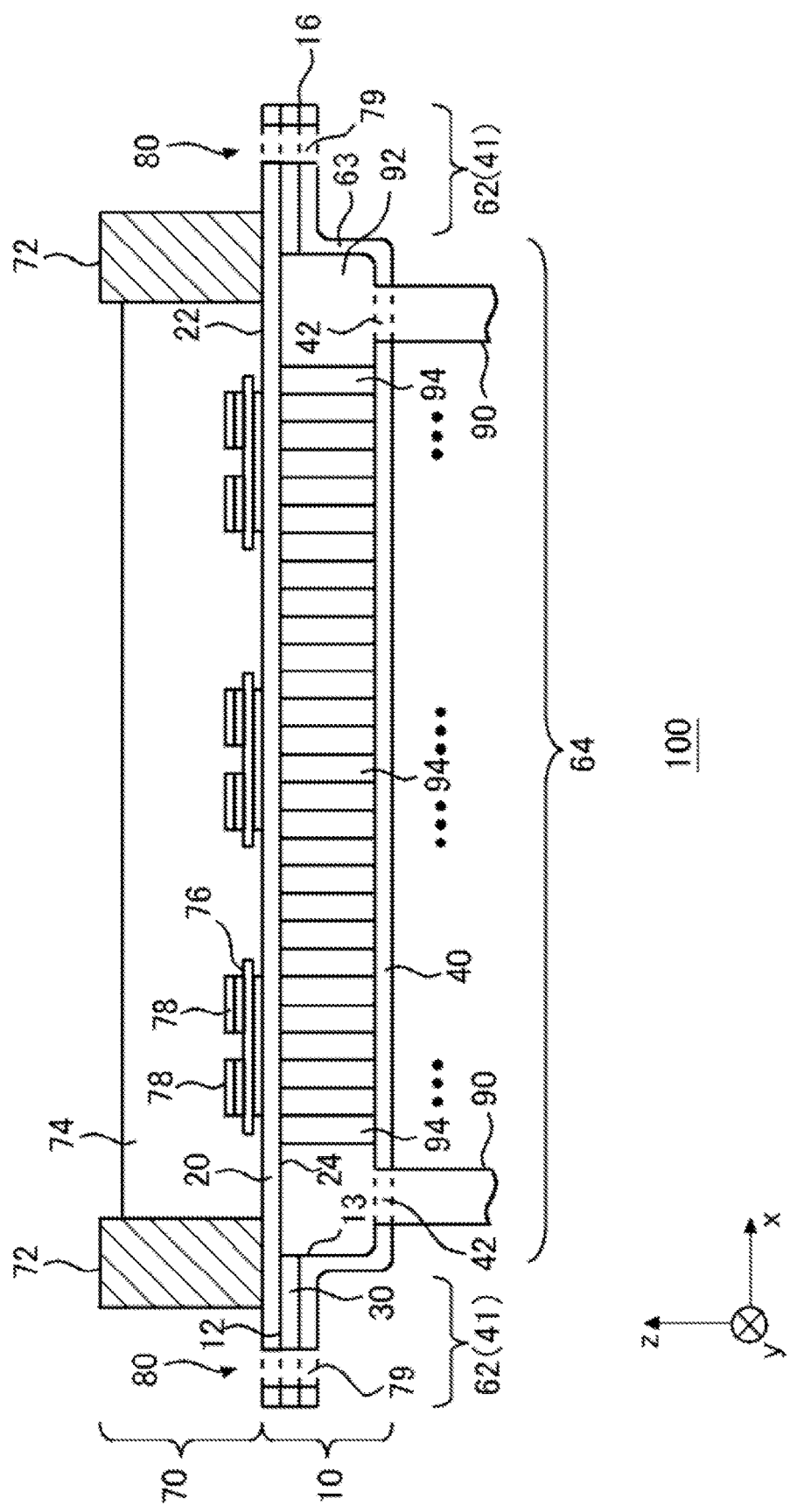
FIG. 1 is a schematic cross-sectional view showing an example of a semiconductor module 100 according to one embodiment of the present invention.

FIG. 1 is a schematic cross-sectional view showing an example of a semiconductor module 100 according to one embodiment of the present invention. The semiconductor module 100 includes a semiconductor device 70 and a cooling apparatus 10. The semiconductor device 70 in the present example is placed on the cooling apparatus 10. In this specification, the plane of the cooling apparatus 10 on which the semiconductor device 70 is placed is an x-y plane, and a z axis is defined as being directed perpendicular to the x-y plane. In this specification, although the direction from the cooling apparatus 10 to the semiconductor device 70 in the z-axis direction is referred to as an upper direction and the direction opposite to the upper direction lower direction, the upper and lower directions are not limited to the gravitational direction. Also, in this specification, among surfaces of each member, the surface located on the upper side is referred to as an upper surface, the surface located on the lower side is referred to as a lower surface, and the surface located between the upper surface and the lower surface is referred to as a side surface.

The semiconductor device 70 includes one or more semiconductor chips 78 such as a power semiconductor chip. As an example, an insulated gate bipolar transistor (IGBT) formed on the semiconductor substrate such as silicon is provided on the semiconductor chips 78.

The semiconductor device 70 has circuit substrates 76 and an accommodating portion 72. Each of the circuit substrates 76 is a substrate in which a circuit pattern is provided on an insulating substrate, for example. Semiconductor chips 78 are fixed to the circuit substrates 76 via solder or the like. The accommodating portion 72 is formed of an insulating material such as resin. The accommodating portion 72 has an internal space which houses the semiconductor chips 78, the circuit substrates 76, wirings, and the like. The internal space of the accommodating portion 72 may be filled with a sealing portion 74 which seals the semiconductor chips 78, the circuit substrates 76, wirings, and the like. The sealing portion 74 is an insulating member, for example, silicone gel, epoxy resin, or the like.

The cooling apparatus 10 has a ceiling plate 20, a casing portion 40, and a reinforcing member 30. The ceiling plate 20 may be a plate-like metal plate having an upper surface 22 and a lower surface 24 which are parallel to the x-y plane. As an example, the ceiling plate 20 is formed of metal containing aluminum. The semiconductor device 70 is placed on the upper surface 22 of the ceiling plate 20. Heat generated by the semiconductor chips 78 is conducted to the ceiling plate 20. For example, thermally conductive members such as the circuit substrates 76, the metal plate, and the solder are arranged between the ceiling plate 20 and the semiconductor chips 78. The circuit substrates 76 may be directly fixed on the upper surface 22 of the ceiling plate 20 with solder or the like. In this case, the accommodating portion 72 is provided so as to surround the region in which the circuit substrates 76 and the like are arranged on the upper surface 22 of the ceiling plate 20. For another example, the semiconductor device 70 has a metal plate exposed on the lower surface of the accommodating portion 72, the circuit substrates 76 are fixed on the upper surface of the metal plate, and the metal plate may be fixed on the upper surface 22 of the ceiling plate 20.

The casing portion 40 has a coolant circulation portion 92 and an outer edge portion 41 surrounding the coolant circulation portion 92 in the x-y plane. The coolant circulation portion 92 is arranged to face lower surface 24 of the ceiling plate 20. The coolant circulation portion 92 is a region in which a coolant such as water circulates. The coolant circulation portion 92 may be a sealed space in contact with the lower surface 24 of the ceiling plate 20. Also, the casing portion 40 is closely attached, directly or indirectly, to the lower surface 24 of the ceiling plate 20 at the outer edge portion 41 surrounding the coolant circulation portion 92 in the x-y plane. In this manner, the coolant circulation portion 92 is sealed. Note that being closely attached indirectly to each other refers to the state in which the lower surface 24 of the ceiling plate 20 and the casing portion 40 are closely attached to each other via a sealing material, an adhesive, or other members provided between the lower surface 24 of the ceiling plate 20 and the casing portion 40. Close attachment refers to the state in which the coolant inside the coolant circulation portion 92 does not leak from the closely attaching part. Cooling fins 94 are arranged inside the coolant circulation portion 92. The cooling fins 94 may be connected to the lower surface 24 of the ceiling plate 20. The heat generated by the semiconductor chips 78 is transferred to the coolant by causing the coolant to pass through the vicinity of the cooling fins 94. In this manner, the semiconductor device 70 can be cooled. The casing portion 40 in the present example has a frame portion 62, a base plate 64, and a sidewall 63. The outer edge portion 41 may include at least the frame portion 62.

The frame portion 62 is arranged so as to surround the coolant circulation portion 92 in the x-y plane. The upper surface 16 of the frame portion 62 is closely attached, directly or indirectly, to the lower surface 24 of the ceiling plate 20. In other words, the upper surface 16 of the frame portion 62 and the lower surface 24 of the ceiling plate 20 are provided so as to seal the coolant circulation portion 92. A sealing material or other members may be provided between the upper surface 16 of the frame portion 62 and the lower surface 24 of the ceiling plate 20. In the cross section shown in FIG. 1, the reinforcing member 30 is provided between the upper surface 16 of the frame portion 62 and the lower surface 24 of the ceiling plate 20. In other words, the reinforcing member 30 may be provided on the upper surface 16 of the frame portion 62, and the ceiling plate 20 may be provided on the upper surface 12 of the reinforcing member 30.

In the present example, parts between the respective members that are the ceiling plate 20, the casing portion 40, and the reinforcing member 30 are brazed. As an example, the ceiling plate 20, the casing portion 40 and the reinforcing member 30 are formed of a metal of the same composition, and the wax material is formed of a metal having a lower melting temperature than the metal for the ceiling plate 20 and the like. As the metal, a metal containing aluminum may be used. As the metal containing aluminum, an aluminum alloy such as Al—Mn based alloy (3000 series aluminum alloy) and Al—Mg—Si based alloy (6000 series aluminum alloy) may be used. As the wax material, an aluminum alloy such as Al—Si based alloy (4000 series aluminum alloy) may be used. The proof stress of the aluminum alloy used in the present example under room temperature is preferably within the range of 35 to 65 MPa. The proof stress is the stress at which 0.2% permanent strain occurs when a load is removed.

The base plate 64 is arranged so as to have the coolant circulation portion 92 between the lower surface 24 of the ceiling plate 20 and the base plate 64. The base plate 64 in the present example is provided with two or more openings 42 which guide a coolant into/out of the coolant circulation portion 92. A pipe 90 which conveys a coolant is connected to the openings 42. The pipe 90 protrudes away from the cooling fins 94 across the base plate 64 (in the present example, the negative side in the z-axis direction).

The sidewall 63 defines the coolant circulation portion 92 by connecting the frame portion 62 with the base plate 64. The sidewall 63 in the present example connects the inner-side surface 13 of the frame portion 62 with the periphery of the base plate 64. The inner-side surface 13 of the frame portion 62 is the side surface which faces the coolant circulation portion 92. The periphery of the base plate 64 is the perimeter part of the base plate 64 in the x-y plane.

The ceiling plate 20 and the casing portion 40 have fastening portions 80 which fastens them together. Fastening portions 80 may be used to fix the semiconductor module 100 to an external device. As an example, the fastening portions 80 are the regions in which the ceiling plate 20 and the casing portion 40 are closely attached, directly or indirectly, to each other and stacked in the z-axis direction, and in which a through hole 79 which penetrates the ceiling plate 20 and the casing portion 40 is formed. In FIG. 1, the region of the ceiling plate 20 and the casing portion 40 in which the through hole 79 is formed is shown with a dashed line. The fastening portions 80 in the present example are provided in the frame portion 62.

At the fastening portions 80, the reinforcing member 30 is provided between the ceiling plate 20 and the casing portion 40. The ceiling plate 20 and the reinforcing member 30 are closely attached to each other, and the reinforcing member 30 and the casing portion 40 are also closely attached to each other. In the present example, the parts between these members are brazed as described above. Note that the through hole 79 is provided so as to also penetrate the reinforcing member 30.

The strength of the fastening portions 80 where stresses tend to concentrate can be improved by providing the fastening portions 80 with the reinforcing member 30. Also, provision of the reinforcing member 30 can increase the total thickness in the z-axis direction of the metal plates at the fastening portions 80 to improve the strength of the fastening portions 80 without the need of increasing the thicknesses of the sidewall 63 and the base plate 64. Since the thicknesses of the sidewall 63 and the base plate 64 are not increased, the sidewall 63 and the base plate 64 can be relatively easily deformed under the stresses. Therefore, even if, for example, the coolant, the cooling fins and the like inside the coolant circulation portion 92 expand or contract according to temperature changes, the deformation of the sidewall 63 and the base plate 64 facilitates the absorption of the volume change. Also, even if a force is applied to the casing portion 40 at the time of connecting the pipe 90 to the opening 42, the sidewall 63 and the base plate 64 contribute to facilitate the absorption of the force. In this way, the fastening portions 80 can be protected.

The reinforcing member 30 may be provided to extend, in the x-y plane, from the region in which the through hole 79 is provided to a position facing the sidewall 63 of the casing portion 40. This can prevent the frame portion 62 from deforming at the position facing the sidewall 63 and prevent stress concentration at the connecting portion for the sidewall 63 and the frame portion 62. In this manner, the sidewall 63 can be protected. The sidewall 63 may be arranged so as to be flush with the inner-side surface 13 of the reinforcing member 30.

The fastening portions 80 are provided so as to protrude toward the outside beyond the sidewall 63. Note that the term, outside, refers to the direction away from the center of the coolant circulation portion 92 in the x-y plane. Also, the fastening portions 80 are provided so as to protrude toward the outside beyond the accommodating portion 72. In other words, the fastening portions 80 have the cantilever beam structure with the end thereof in the x-y plane not supported by the other members of the semiconductor module 100. Therefore, the fastening portions 80 are relatively easily deformed. However, the provision of the reinforcing member 30 can improve the strength of the fastening portions 80.

The reinforcing member 30 may be formed of a material having higher proof stress than those of the ceiling plate 20 and the casing portion 40. An example of such a material includes an aluminum alloy having a proof stress of 50 MPa or more, preferably an aluminum alloy having a proof stress of 50-65 MPa. This can improve the strength of the fastening portions 80.

Figure 2A:
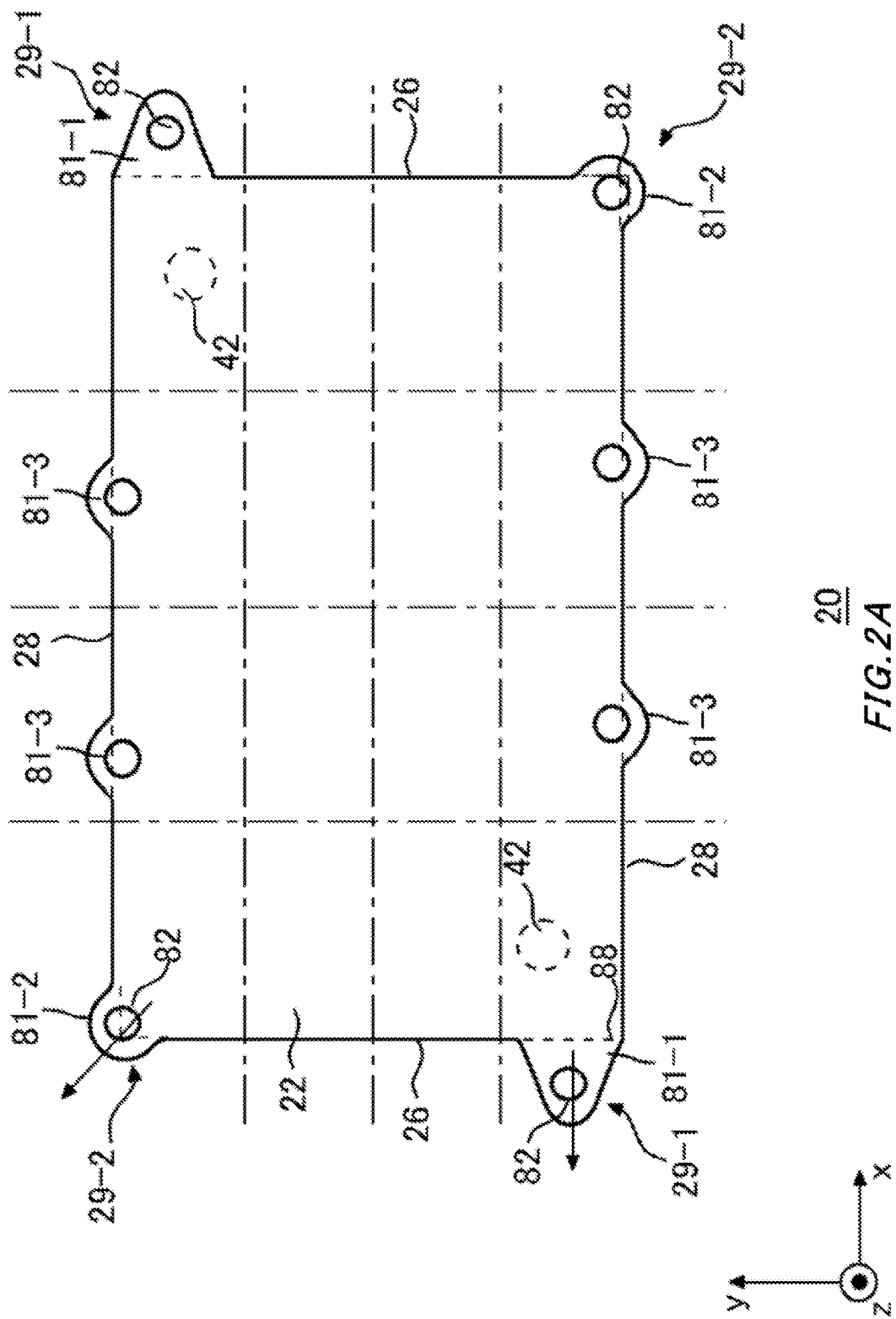
FIG. 2A is a diagram showing an example of the shape of a ceiling plate 20 as viewed from above (in the x-y plane).

FIG. 2A is a diagram showing an example of the shape of the ceiling plate 20 as viewed from above (in the x-y plane). The ceiling plate 20 has two sets of facing sides 26, 28 when viewed from above. The ceiling plate 20 in the present example has a substantially rectangular shape having short sides 26 and long sides 28. The ceiling plate 20 has four corners 29. In this specification, the direction in which the short sides 26 extend is the y axis, and the direction in which the long sides 28 extend is the x axis.

Also, the perimeter 88 of rectangular shape defined with the long sides 28 and the short sides 26 is the perimeter of the ceiling plate 20. In other words, the shape of the perimeter 88 is the shape obtained by replacing the convex or concave parts on the long sides 28 and the short sides 26 of the ceiling plate 20 with extending lines of the long sides 28 and the short sides 26. In FIG. 2A, the perimeter 88 is shown with a dashed line.

The corners 29 refer to the regions near respective vertexes on the perimeter 88 of the ceiling plate 20. As an example, the corners 29 are the four regions located at the corners of the perimeter 88, out of the sixteen regions resulted from the quadrisection of the perimeter 88 of the ceiling plate 20 in each of the x axis and the y axis as shown by the long dashed short dashed lines in FIG. 2A. In the present example, the corner 29 arranged so as to face the opening 42 of the casing portion 40 is referred to as a first corner 29-1, and the corner 29 other than the first corner 29-1 is referred to as a second corner 29-2. The first corner 29-1 may include the region facing the opening 42 entirely or partially. In FIG. 2A, the region facing the opening 42 is shown with a dashed line.

The ceiling plate 20 is provided with one or more fastening portions 81 which are parts of the fastening portions 80 shown in FIG. 1. The at least one fastening portion 81 may be provided at the corners 29. In the present example, the fastening portion 81 is provided at all the corners 29. Also, respective long sides 28 may or may not be provided with the fastening portions 81. Respective short sides 26 may or may not be provided with the fastening portions 81.

Each fastening portion 81 is provided so as to protrude toward the outside of the perimeter 88 at the perimeter 88 of the ceiling plate 20. The term, outside, in the present example refers to the direction away from the center of the ceiling plate 20 in the x-y plane. Each fastening portion 81 has a through hole 82 which is a part of the through hole 79 shown in FIG. 1. The through hole 82 may be arranged outside the perimeter 88, may be arranged inside the perimeter 88, or may be arranged so as to overlap the perimeter 88.

In the present example, in the first fastening portion 81-1 at the first corner 29-1, the entire through hole 82 is arranged outside the perimeter 88. The through hole 79 in the second fastening portion 81-2 at the second corner 29-2 and the through hole 79 in the third fastening portion 81-3 at each side may be arranged inside the perimeter 88, or may be arranged so as to overlap the perimeter 88. The pipe 90 is connected to the opening 42. Arranging the through hole 82 in first fastening portion 81-1 outside the perimeter 88 can facilitate the operation of connecting the pipe 90, the operation of fastening screws or the like to the through hole 82 in the first fastening portion 81-1, and the like.

Also, the length by which the first fastening portion 81-1 protrudes toward the outside of the perimeter 88 is preferably greater than the length by which another fastening portion 81 protrudes toward the outside of the perimeter 88. This enables the through hole 82 in the first fastening portion 81-1 to be arranged distant from the opening 42. Also, as described in FIG. 1, since the reinforcing member 30 and the fastening portion 81 are stacked, the strength can be maintained even if the protruding length of the first fastening portion 81-1 is increased.

The first fastening portion 81-1 may be provided so as to protrude from the perimeter 88 toward the direction parallel to the long sides 28 (that is, the x-axis direction) in the x-y plane. Here, the direction may contain a predetermined error in parallelism. For example, an angle between one of the long sides 28 and the direction in which the first fastening portion 81-1 protrudes may be 20° or less. The direction in which the fastening portion 81 protrudes may be the direction given by connecting the vertex of the fastening portion 81 (the point farthest from the perimeter 88) and the perimeter 88 such that the distance between them is the shortest. In FIG. 2A, the directions in which some of the fastening portions 81 protrude are shown by arrows. In this manner, even if the protruding length of the first fastening portion 81-1 is increased, increase in the size of the ceiling plate 20 in the y-axis direction can be suppressed.

Note that the second fastening portion 81-2 may be provided so as to protrude in the direction different from the direction in which the first fastening portion 81-1 protrudes.

In the example of FIG. 2A, the second fastening portion 81-2 protrudes in such a direction as to make 45° with the y axis. Since the protruding length of the second fastening portion 81-2 is relatively small, the ceiling plate 20 is not increased in size too much even if it protrudes in the direction. Also, the third fastening portion 81-3 protrudes from the perimeter 88 in the y-axis direction. The length by which the second fastening portion 81-2 protrudes from the perimeter 88 in the y-axis direction may be the same as the length by which the third fastening portion 81-3 protrudes from the perimeter 88 in the y-axis direction. In FIG. 2A, two first fastening portions 81-1 may be arranged symmetrically about the center of the ceiling plate 20 in the x-y plane. Similarly, two second fastening portions 81-2 may be arranged symmetrically about the center of the ceiling plate 20 in the x-y plane.

Figure 2B:
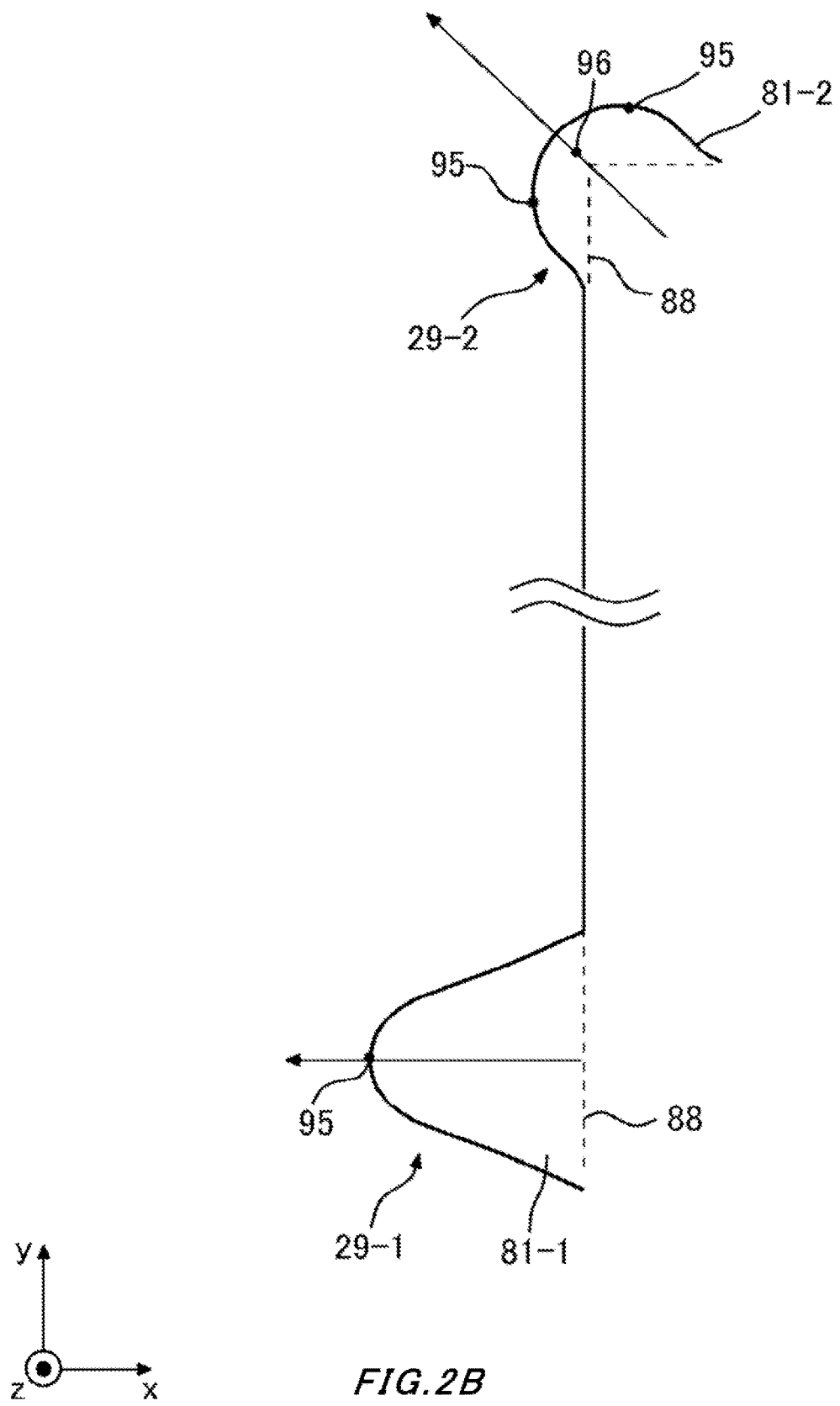
FIG. 2B is a diagram illustrating protruding directions of fastening portions 81.

FIG. 2B is a diagram illustrating protruding directions of the fastening portions 81. In FIG. 2B, an enlarged view of vicinities of the fastening portion 81-1 and the fastening portion 81-2 are shown. In FIG. 2B, the through hole 82 in each of the fastening portions 81 is omitted. In the present example, the point in each of the protruding portions 81 farthest from the perimeter 88 in the x-y plane is a vertex 95. As described above, the protruding direction of the fastening portion 81 is the direction given by connecting the vertex 95 with the perimeter 88 such that the distance between them is the shortest. In this regard, when there is a plurality of vertexes 95 as in the fastening portion 81-2, the protruding direction of the fastening portion 81 may be the direction given by connecting the average position 96 of the plurality of vertexes 95 in the x-y coordinate space with the perimeter 88 such that the distance between them is the shortest. The average position 96 of the plurality of vertexes 95 is the position indicating the average of the coordinate values of the plurality of vertexes 95 in each of the x coordinate and the y coordinate.

Figure 3:
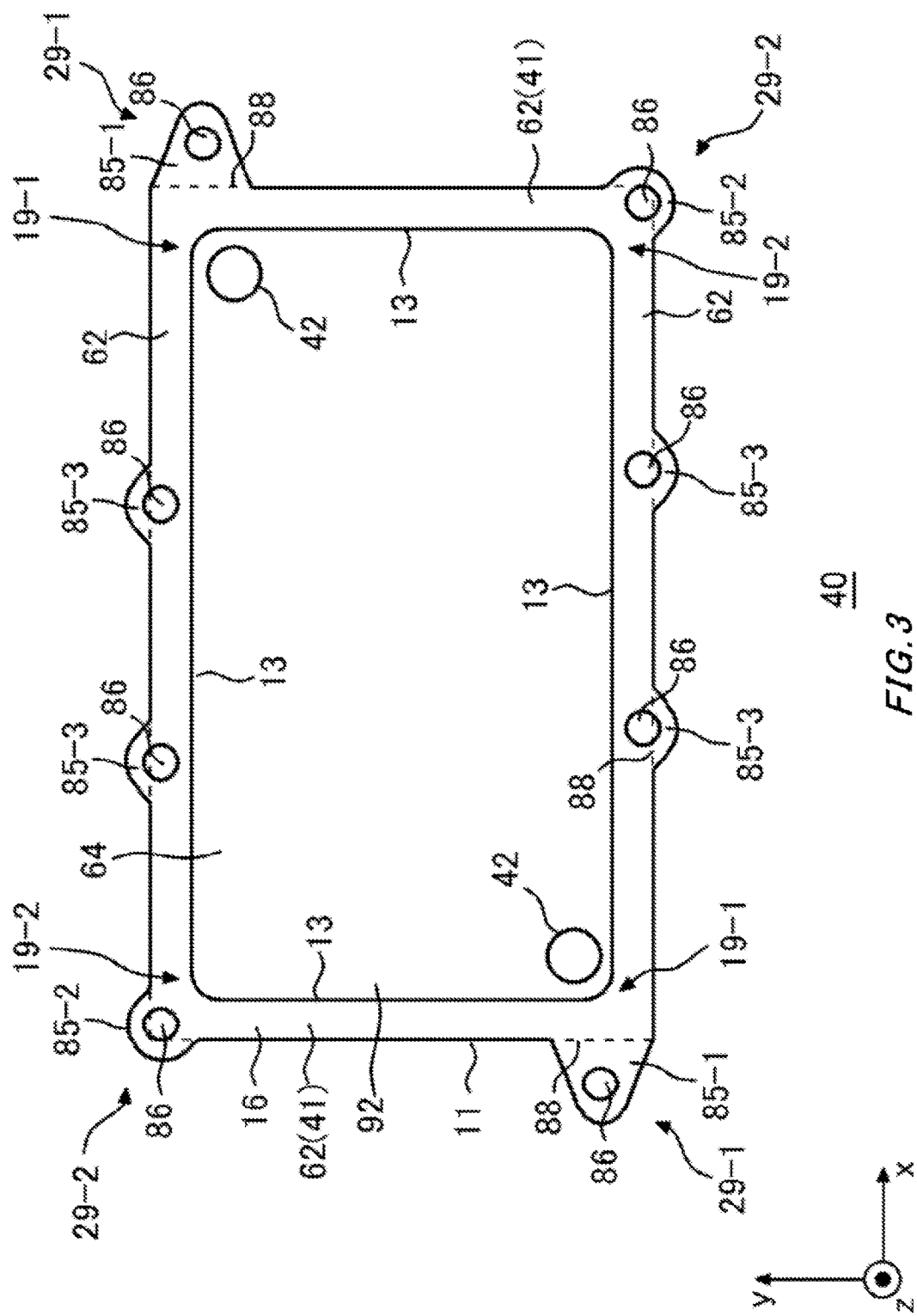
FIG. 3 is a diagram showing an example of the shape of a casing portion 40 as viewed from above (in the x-y plane).

FIG. 3 is a diagram showing an example of the shape of the casing portion 40 as viewed from above (in the x-y plane). The contour of the casing portion 40 in the present example in the x-y plane is the same as the contour of the ceiling plate 20. In the present example, the contour of the frame portion 62 corresponds to the contour of the casing portion 40. The frame portion 62 has an inner-side surface 13 facing the coolant circulation portion 92 and an outer-side surface 11 opposite to the inner-side surface 13. The respective side surfaces in the present example are the planes substantially perpendicular to the x-y plane. In FIG. 3, the perimeter 88 of the ceiling plate 20 shown is superposed on the shape of the casing portion 40. Also, similar to the ceiling plate 20, the casing portion 40 has corners 29 in the x-y plane.

Similar to the ceiling plate 20, corners 29 of the casing portion 40 are each provided with a fastening portion 85. Further, any sides of the casing portion 40 may be provided with the fastening portion 85. The fastening portion 85 is provided so as to protrude from the frame portion 62 toward the outside of the perimeter 88. In the present example, the shape of each fastening portion 85 in the x-y plane is the same as the shape of the fastening portion 81 it faces. Each fastening portion 85 is provided with a through hole 86. The through hole 86 is provided so as to overlap the through hole 82 shown in FIG. 2A.

The base plate 64 is provided on the inner side of the frame portion 62 in the x-y plane. The base plate 64 has four corners 19. Similar to the corners 29, the corners 19 may be four regions located at the corners, out of the sixteen regions resulted from the quadrisection of the perimeter of the base plate 64 in each of the x axis and the y axis. The fastening portions 85 are provided so as to protrude, at the perimeter 88 of the ceiling plate 20, toward the outside away from the openings 42 and the corners 19 of the base plate 64.

Any corners 19 of the base plate 64 may be provided with the opening 42 which connects the coolant circulation portion 92 with the outside. The base plate 64 in the present example is provided with the openings 42 respectively at two corners 19 arranged symmetrically about the center of the base plate 64 in the x-y plane. As shown in FIG. 2A and FIG. 3, the corner 29-1 of the ceiling plate 20 at which the fastening portion 81-1 is provided and the corner 19-1 of the base plate 64 at which the opening 42 is provided are positioned to face each other.

The corners 19 in the present example are each defined, using relative positions in the x axis and the y axis, as the corner 19 on the positive side in the x-axis direction and the positive side in the y-axis direction (the corner 19-1 in the example of FIG. 3), the corner on the positive side in the x-axis direction and the negative side in the y-axis direction (the corner 19-2 in the example of FIG. 3), the corner on the negative side in the x-axis direction and the positive side in the y-axis direction (the corner 19-2 in the example of FIG. 3), and the corner 19 on the negative side in the x-axis direction and the negative side in the y-axis direction (the corner 19-1 in the example of FIG. 3). Similarly, the corners 29 are respectively defined, using relative positions in the x axis and the y axis, as the corner 29 on the positive side in the x-axis direction and the positive side in the y-axis direction (the corner 29-1 in the example of FIG. 2A), the corner on the positive side in the x-axis direction and the negative side in the y-axis direction (the corner 29-2 in the example of FIG. 2A), the corner on the negative side in the x-axis direction and the positive side in the y-axis direction (the corner 29-2 in the example of FIG. 2A), and the corner 29 on the negative side in the x-axis direction and the negative side in the y-axis direction (the corner 29-1 in the example of FIG. 3). The two corners in the base plate 64 and the ceiling plate 20 which face each other refer to the corner 19 and the corner 29 the relative positions in the x axis and the y axis of which correspond to each other. To be more specific, the corner 19 on the positive side in the x-axis direction and the positive side in the y-axis direction faces the corner 29 on the positive side in the x-axis direction and the positive side in the y-axis direction, the corner 19 on the positive side in the x-axis direction and the negative side in the y-axis direction faces the corner 29 on the positive side in the x-axis direction and the negative side in the y-axis direction, the corner 19 on the negative side in the x-axis direction and the positive side in the y-axis direction faces the corner 29 on the negative side in the x-axis direction and the positive side in the y-axis direction, and the corner 19 on the negative side in the x-axis direction and the negative side in the y-axis direction faces the corner 29 on the negative side in the x-axis direction and the negative side in the y-axis direction.

Figure 4:
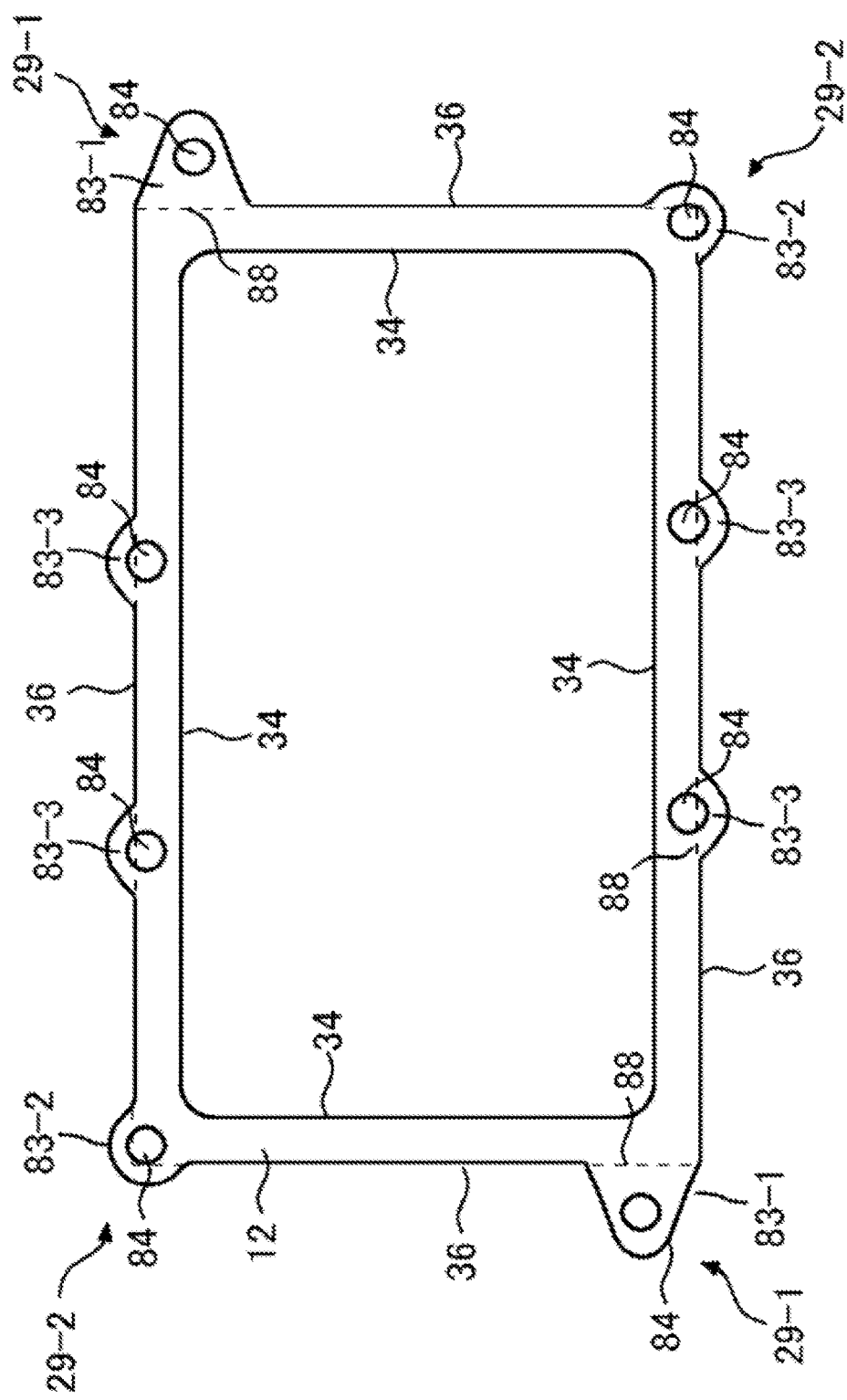
FIG. 4 is a diagram showing an example of the shape of a reinforcing member 30 as viewed from above (in the x-y plane).

FIG. 4 is a diagram showing an example of the shape of the reinforcing member 30 as viewed from above (in the x-y plane). The reinforcing member 30 in the present example is provided so as to surround the coolant circulation portion 92 shown in FIG. 1. The contour of the reinforcing member 30 in the present example in the x-y plane is the same as the contour of the ceiling plate 20. In FIG. 4, the perimeter 88 of the ceiling plate 20 shown is superposed on the shape of the reinforcing member 30.

The reinforcing member 30 may have the same shape in the x-y plane as the frame portion 62 of the casing portion 40 has. The reinforcing member 30 is arranged between the upper surface 16 of the frame portion 62 and the lower surface 24 of the ceiling plate 20. The reinforcing member 30 has an inner-side surface 34 facing the coolant circulation portion 92 and an outer-side surface 36 opposite to the inner-side surface 34. The inner-side surface 34 of the reinforcing member 30 may be arranged so as to be flush with the inner-side surface 13 of the frame portion 62 of the casing portion 40. The outer-side surface 36 of the reinforcing member 30 may be arranged so as to be flush with the outer-side surface 11 of the frame portion 62 of the casing portion 40.

Also, similar to the ceiling plate 20, the reinforcing member 30 has corners 29 in the x-y plane. Similar to the ceiling plate 20, corners 29 of the reinforcing member 30 are each provided with a fastening portion 83. Further, any sides of the reinforcing member 30 may be provided with the fastening portion 83. In the present example, the shape of each fastening portion 83 in the x-y plane is the same as the shape of the fastening portion 81 it faces. Each fastening portion 83 is provided with a through hole 84. The through hole 84 is provided so as to overlap the through hole 82 shown in FIG. 2A.

Figure 5:
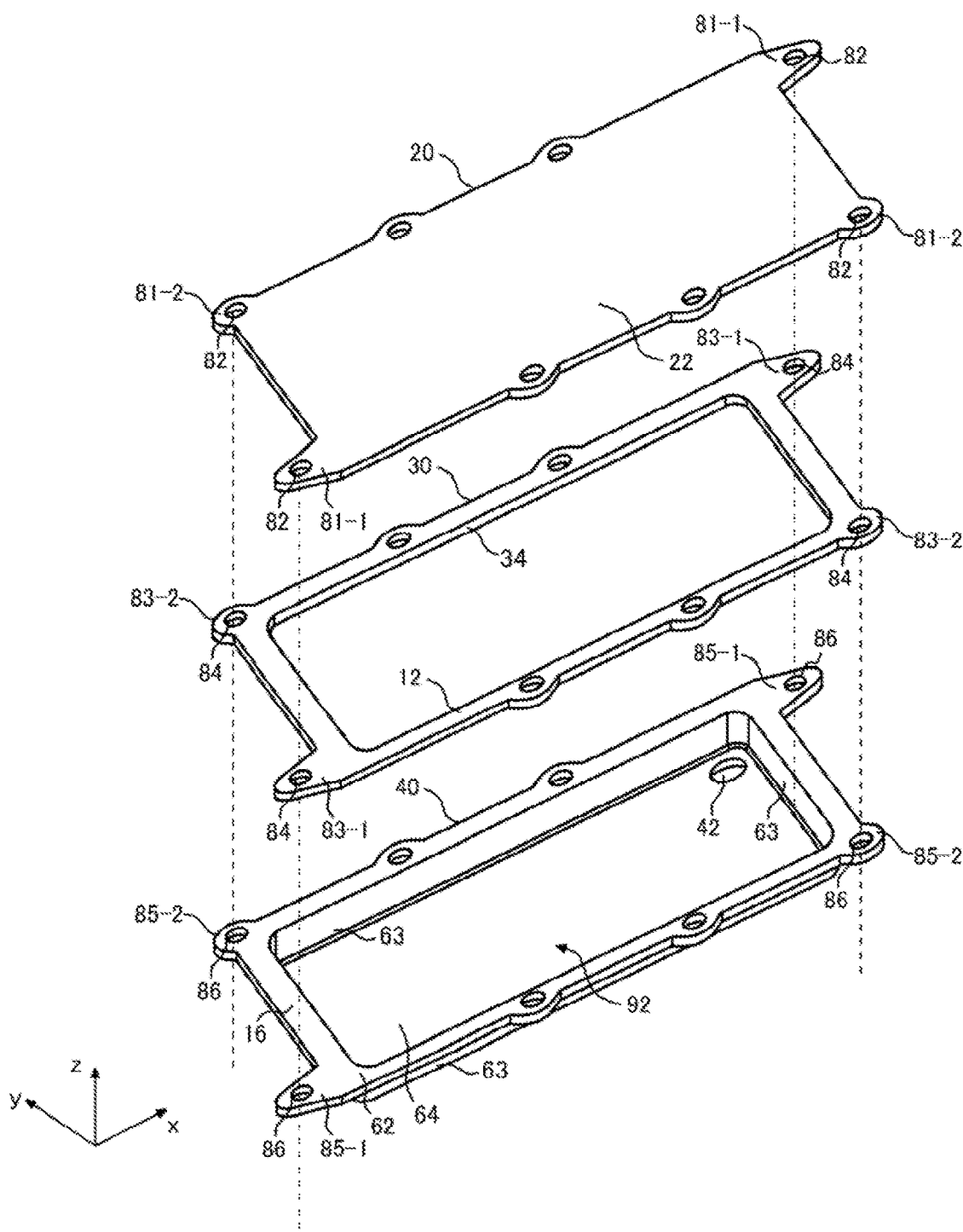
FIG. 5 is a perspective view separately showing the ceiling plate 20, the reinforcing member 30, and the casing portion 40.

FIG. 5 is a perspective view separately showing the ceiling plate 20, the reinforcing member 30, and the casing portion 40. As described above, the ceiling plate 20, the reinforcing member 30, and the casing portion 40 may have the same contour in the x-y plane. The fastening portions of the ceiling plate 20, the fastening portions of the reinforcing member 30 and the fastening portions of the casing portion 40 have the same shape in the x-y plane, and they may be stacked in the z-axis direction. In FIG. 5, the positions where the ceiling plate 20, the reinforcing member 30, and the casing portion 40 overlap when they are fixed by brazing or the like are shown with dashed lines. Note that the cooling fins 94 arranged in the coolant circulation portion 92 are omitted in FIG. 5. Further, a wax material between the respective members is also omitted.

As shown in FIG. 5, the reinforcing member 30 is arranged so as to surround the coolant circulation portion 92 and between the ceiling plate 20 and the casing portion 40, and seals the coolant circulation portion 92. The frame portion 62 of the casing portion 40 is fixed to the ceiling plate 20 via the reinforcing member 30. The casing portion 40 has the base plate 64 arranged distant from the ceiling plate 20 and the sidewall 63 connecting the base plate 64 and the frame portion 62. The lower surface 24 of the ceiling plate 20, the inner-side surface 34 of the reinforcing member 30, and the casing portion 40 define the coolant circulation portion 92.

The fastening portions 80 are provided so as to protrude, at the perimeter 88 of the ceiling plate 20, toward the outside away from the openings 42 and the corners 19 of the base plate 64 (see FIG. 3). Also, the frame portion 62, the reinforcing member 30, and the ceiling plate 20 are stacked in this order in the fastening portions 80, and the fastening portions 80 each has the through hole 79 which penetrates the frame portion 62, the reinforcing member 30, and the ceiling plate 20 (see FIG. 1). The through holes 82, 84, and 86 may be provided so as to be coaxial to each other.

Note that the ceiling plate 20, the reinforcing member 30, and the casing portion 40 may have the same thickness at the fastening portions 80. The ceiling plate 20, the reinforcing member 30 and the casing portion 40 may have the same thickness at the region other than the fastening portions 80.

Also, the frame portion 62 and the sidewall 63 of the casing portion 40 may be provided integrally. The frame portion 62 and the sidewall 63 may be formed by forging one plate-like metal. Also, the base plate 64 may be provided integrally with the sidewall 63, or may be brazed to the sidewall 63. The base plate 64, the frame portion 62, and the sidewall 63 may have the same thickness. As an example, the thickness of the base plate 64 at the position facing the center of the lower surface 24 of the ceiling plate 20 may be the same as the thickness of the frame portion 62 at the fastening portions 80. With the respective members having the same thickness, the cooling apparatus 10 can be manufactured using a common metal roll material.

Figure 6:
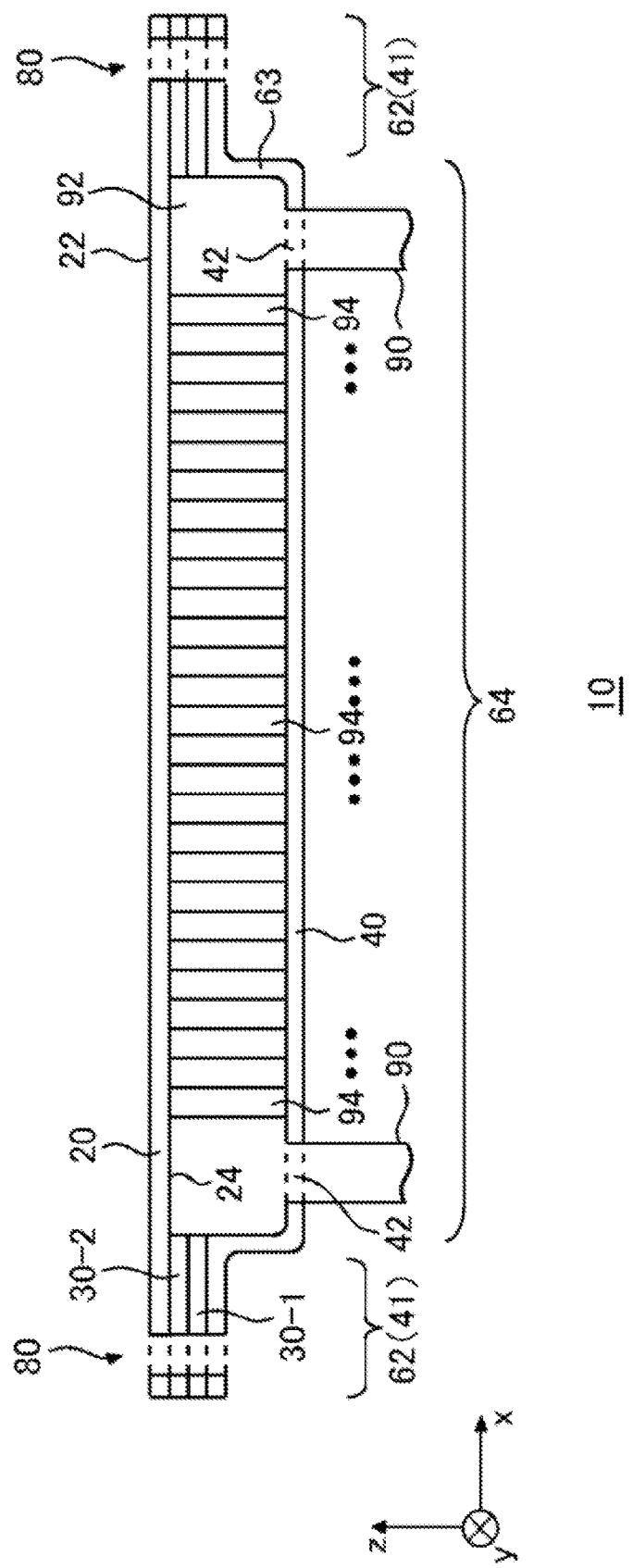
FIG. 6 is a diagram showing the cross section of the cooling apparatus 10 according to another example.

FIG. 6 is a diagram showing the cross section of the cooling apparatus 10 according to another example. In the cooling apparatus 10 in the present example, a plurality of reinforcing members 30 are provided in a stacked manner. The thickness of each of the reinforcing members 30 may be the same as the thickness of the ceiling plate 20. The thicknesses of the plurality of reinforcing members 30 which are stacked may be the same. The thickness of the fastening portions 80 can be changed as desired by adjusting the number of the reinforcing members 30, to adjust the strength of the fastening portions 80. In another example, the thickness of the fastening portions 80 may be adjusted by providing one reinforcing member 30 between the ceiling plate 20 and the casing portion 40 and adjusting the thickness of the reinforcing member 30.

Figure 7:
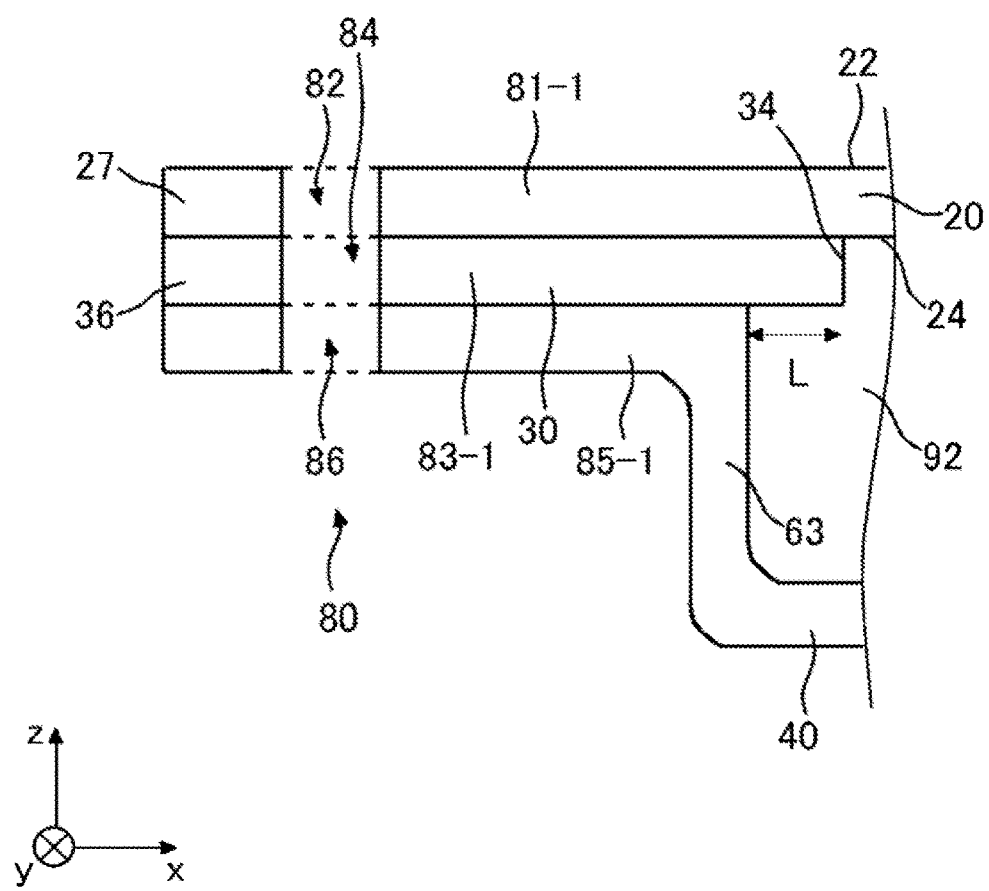
FIG. 7 is a diagram showing the cross section of the cooling apparatus 10 according to another example.

FIG. 7 is a diagram showing the cross section of the cooling apparatus 10 according to another example. In FIG. 7, an enlarged view of the vicinity of each of the fastening portions 80 is shown. The ceiling plate 20 in the present example has the side surface 27 along the perimeter. As described above, the reinforcing member 30 has the inner-side surface 34 facing the coolant circulation portion 92 and the outer-side surface 36 opposite to the inner-side surface 34. In the present example, the outer-side surface 36 of the reinforcing member 30 is arranged so as to be flush with the side surface 27 of the ceiling plate 20. The cooling apparatus 10 in the present example is different from the cooling apparatuses 10 in the respective aspects described in FIG. 1 to FIG. 6 in that the reinforcing member 30 is provided so as to extend to the inside of the coolant circulation portion 92. The other parts of the structure other than the reinforcing member 30 may be the same as those of the cooling apparatus 10 in any aspect described in FIG. 1 to FIG. 6.

In the present example, the inner-side surface 34 of the reinforcing member 30 is arranged more inwardly (in the direction toward the center of the coolant circulation portion 92 in the x-y plane) than the sidewall 63. In other words, the reinforcing member 30 may protrude from the sidewall 63 toward the opening 42 as if it were eaves when viewed from above. With such a structure, the sidewall 63 can be supported by the reinforcing member 30 with more certainty. For example, the sidewall 63 can be supported even if the variation in dimensions or positions of the reinforcing member 30 exists. Therefore, distortion of the sidewall 63 in the z-axis direction is prevented and the sidewall 63 can be protected. In FIG. 7, the length in the x-y plane by which the reinforcing member 30 protrudes from the sidewall 63 is L.

Figure 8:
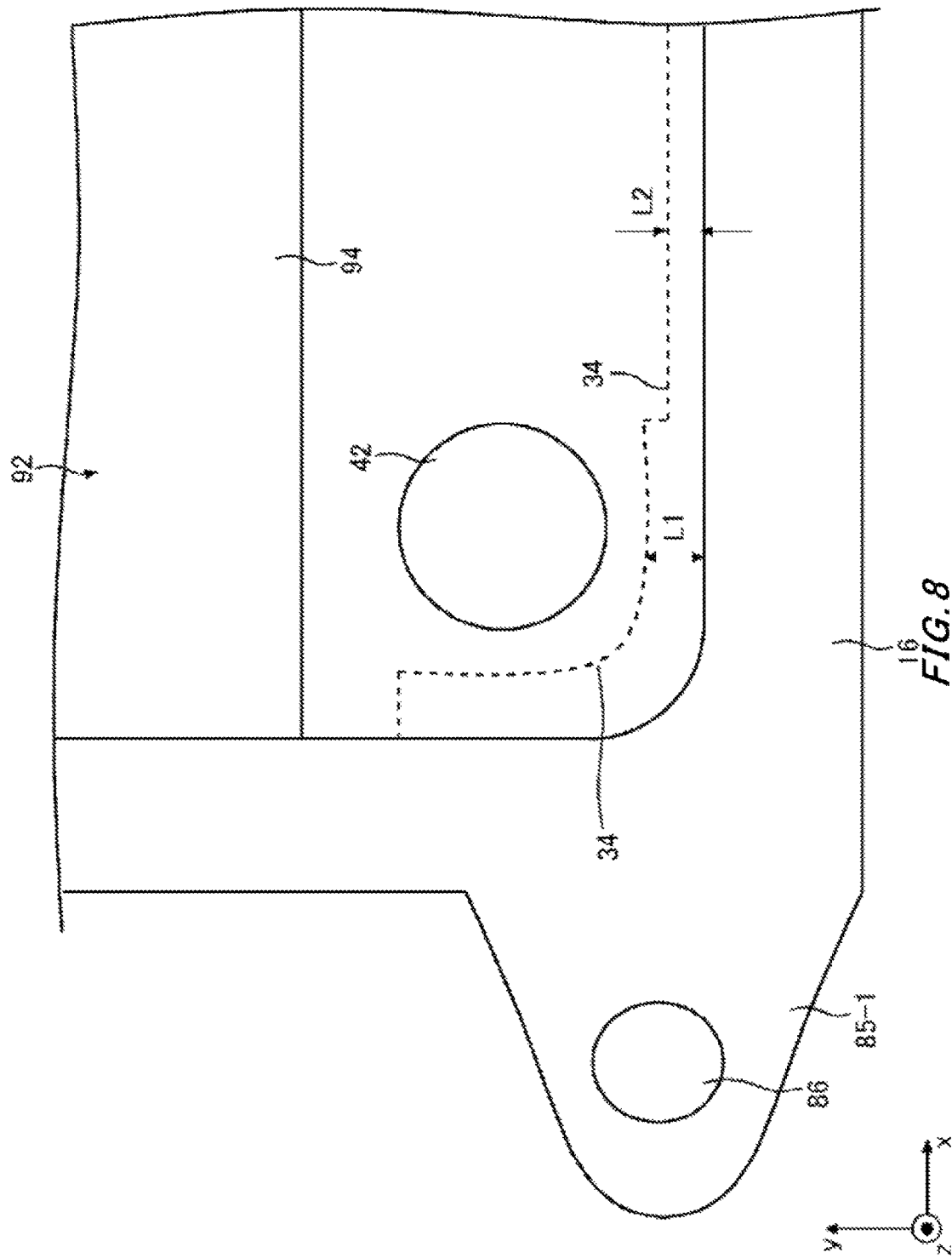
FIG. 8 is a top view showing an arrangement example of an inner-side surface 34 of the reinforcing member 30.

FIG. 8 is a top view showing an arrangement example of the inner-side surface 34 of the reinforcing member 30. In FIG. 8, an enlarged view of the casing portion 40 in the vicinity of the fastening portion 85 is shown. The length L1 by which the reinforcing member 30 protrudes into the inside of the coolant circulation portion 92 in a region facing the opening 42 may be longer than the length L2 by which the reinforcing member 30 protrudes into the inside of the coolant circulation portion 92 in a region facing the cooling fins 94.

The region facing the opening 42 may refer to the region facing the opening 42 in the direction parallel to either of the x axis or the y axis. The region facing the cooling fins 94 may refer to the region that faces the cooling fins 94 in the direction parallel to either of the x axis or the y axis and that does not face the opening 42.

As the length L1, the protruding length of the reinforcing member 30 facing, in the direction parallel to either of the x axis or the y axis, the center of the opening 42 in the x-y plane may be used. As the length L2, the protruding length of the reinforcing member 30 facing, in the direction parallel to either of the x axis or the y axis, the center of the cooling fins 94 in the x-y plane may be used.

Increasing the protruding length L1 of the reinforcing member 30 facing the opening 42 can make the region where stresses tend to be generated such as at the time of connecting the pipe 90 stronger. Also, decreasing the protruding length L2 of the reinforcing member 30 facing the cooling fins 94 can prevent the cooling fins 94 and the reinforcing member 30 from interfering each other. The length L2 may be zero.

Figure 9:
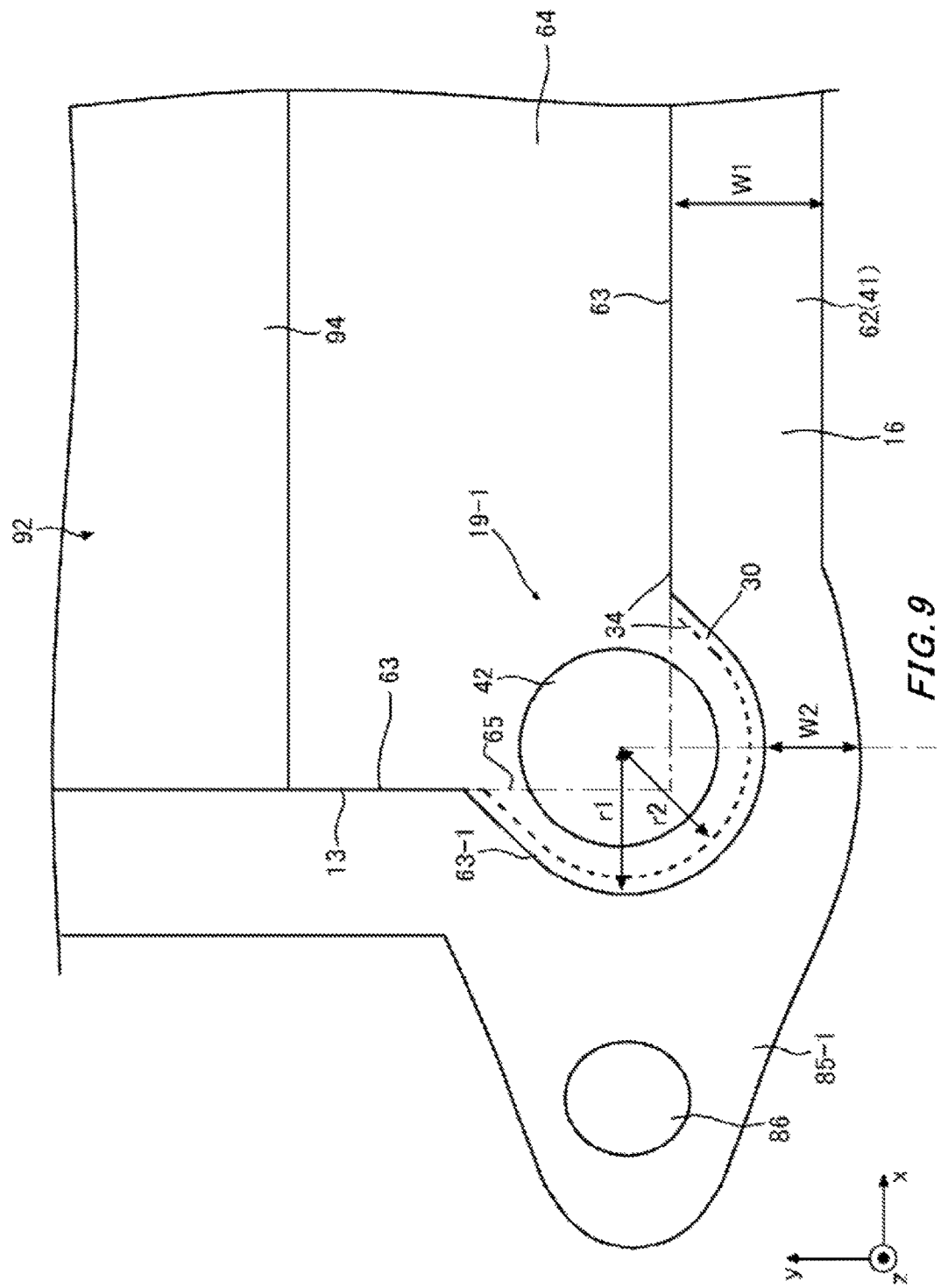
FIG. 9 is a diagram showing another example of the shapes of the casing portion 40 and the reinforcing member 30.

FIG. 9 is a diagram showing another example of the shapes of the casing portion 40 and the reinforcing member 30. The sidewall 63 of the casing portion 40 in the present example is provided so as to extend in the direction away from the center of the coolant circulation portion 92 as viewed from above (in FIG. 9, in the direction having −x and −y components), at the corner 19-1 of the base plate 64 where the opening 42 is arranged. The extended sidewall 63-1 is arranged outside the extending lines 65 given by extending the other sidewalls 63, when viewed from above. At least a part of the opening 42 may be arranged so as to be surrounded by the sidewall 63-1. At least a partial region of the opening 42 may be arranged outside the extending line 65. The shape of the sidewall 63-1 as viewed from above may be an arc. In other words, the sidewall 63-1 may have a curved surface part.

When viewed from above, the center position of the arc of the sidewall 63-1 may coincide with the center position of the opening 42. The coolant guided through the opening 42 can be directed to the cooling fins 94 by providing the sidewall 63-1.

The frame portion 62 may be curved toward the outside of the coolant circulation portion 92 along the sidewall 63-1. The width W2 of the frame portion 62 at the part in which the sidewall 63-1 is provided may be smaller than the width W1 of the frame portion 62 at the part in which the sidewall 63 other than the sidewall 63-1 is provided.

The reinforcing member 30 may have the same shape as the frame portion 62 of the casing portion 40 when viewed from above. The inner-side surface 34 of the reinforcing member 30 may coincide with the inner-side surface 13 of the frame portion 62 when viewed from above. The distance r2 from the center of the opening 42 to the inner-side surface 34 of the reinforcing member 30 may be the same as the distance r1 from the center of the opening 42 to the sidewall 63-1, when viewed from above. Also, the distance r2 may be shorter than the distance r1. In other words, the reinforcing member 30 may protrude from the sidewall 63-1 toward the opening 42 as if it were eaves, as shown with the dashed line in the figure. The strength of the region stresses tend to be generated such as at the time of connecting the pipe 90 can be improved by making the distance r2 shorter than the distance r1.

The structure shown in FIG. 9 may be applied to the embodiments described in FIG. 1 to FIG. 8. Further, although the vicinity of one corner 19-1 is shown in FIG. 9, the vicinities of one or more other corners 19-1 may also have the similar structure. Also, the ceiling plate 20 may have a shape similar to that of the casing portion 40 shown in FIG. 9 when viewed from above.

Figure 10:
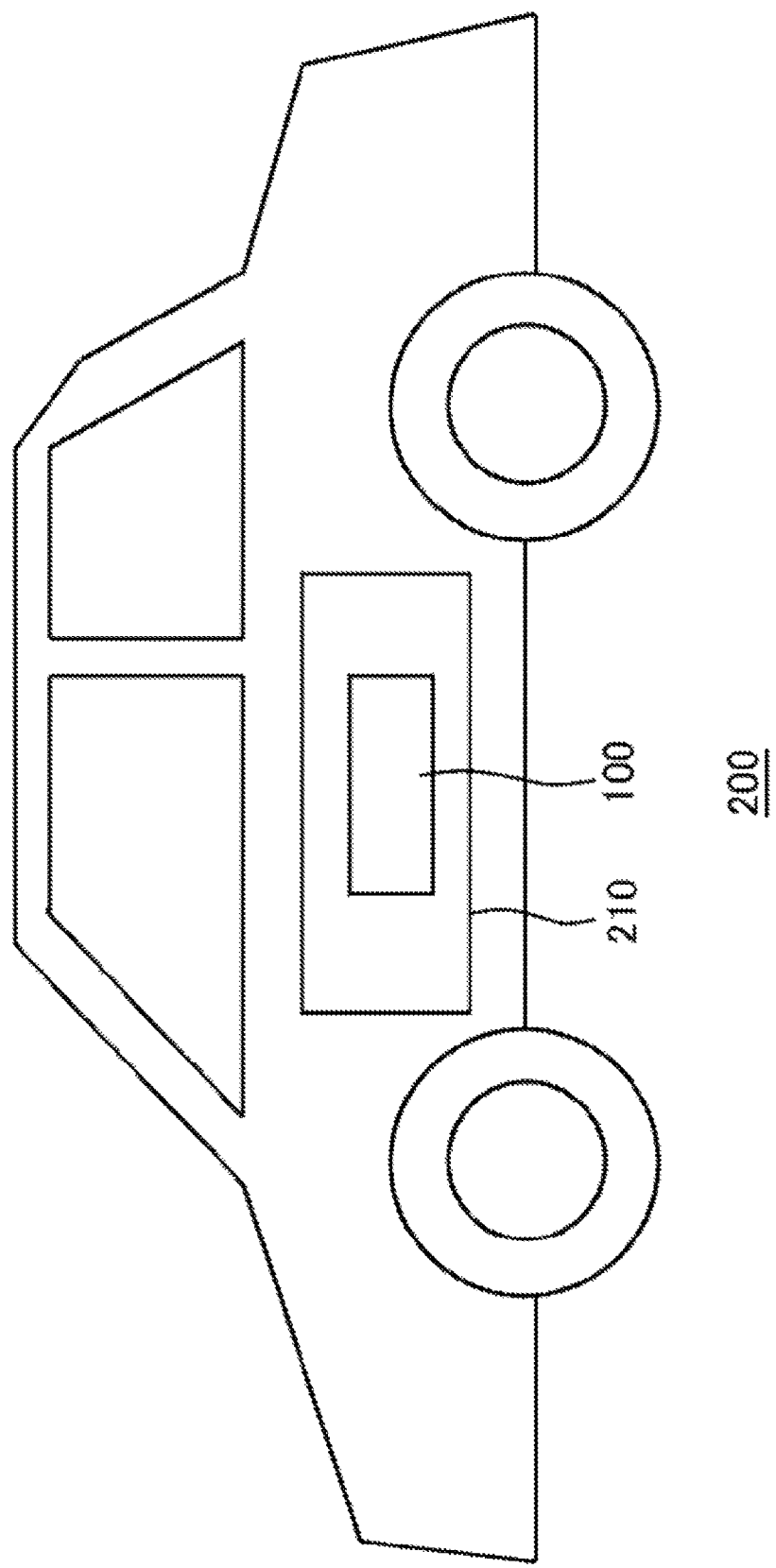
FIG. 10 is a schematic diagram showing a vehicle 200 according to one embodiment of the present invention.

FIG. 10 is a schematic diagram showing a vehicle 200 according to one embodiment of the present invention. A vehicle 200 is a vehicle which generates at least part of thrust by using electric power. As an example, the vehicle 200 is an electric vehicle in which a power-driven device such as a motor generates all of thrust, or a hybrid vehicle which uses a power-driven device such as a motor in conjunction with an internal combustion engine driven by fuel such as gasoline.

The vehicle 200 includes a control apparatus 210 (an external device) configured to control the power-driven device such as a motor. The control apparatus 210 is provided with the semiconductor module 100. The semiconductor module 100 may control electric power to be supplied to the power driven device.

Figure 11:
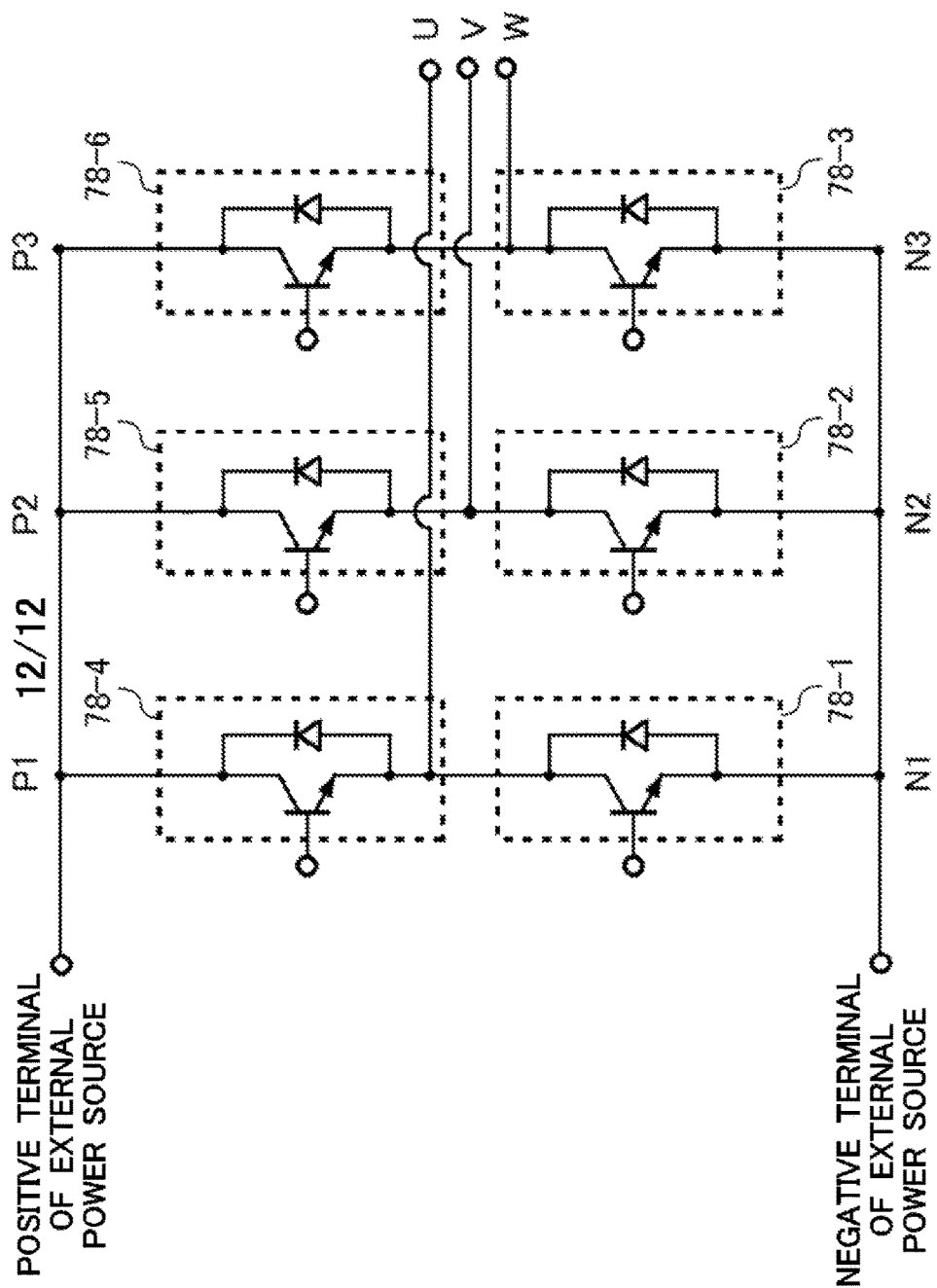
FIG. 11 is a main circuit diagram of the semiconductor module 100 according to one embodiment of the present invention.

FIG. 11 is a main circuit diagram of the semiconductor module 100 according to one embodiment of the present invention. The semiconductor module 100 may be a part of an in-vehicle unit configured to drive the motor of a vehicle. The semiconductor module 100 may serve as a three-phase alternating current inverter circuit having output terminals U, V, and W.

Semiconductor chips 78-1, 78-2, and 78-3 may constitute a lower arm of the semiconductor module 100, and the semiconductor chips 78-4, 78-5, and 78-6 may constitute an upper arm of the semiconductor module 100. A pair of semiconductor chips 78-1, 78-4 may constitute a leg. Similarly, a pair of semiconductor chips 78-2, 78-5 and a pair of semiconductor chips 78-3, 78-6 may each constitute a leg. The emitter electrode and the collector electrode of the semiconductor chip 78-1 may be electrically connected to an input terminal N1 and an output terminal U, respectively. The emitter electrode and the collector electrode of the semiconductor chip 78-4 may be electrically connected to the output terminal U and an input terminal P1, respectively. Similarly, the emitter electrode and the collector electrode of the semiconductor chip 78-2 may be electrically connected to an input terminal N2 and an output terminal V, respectively, and the emitter electrode and the collector electrode of the semiconductor chip 78-3 may be electrically connected to an input terminal N3 and an output terminal W, respectively. Further, the emitter electrode and the collector electrode of the semiconductor chip 78-5 may be electrically connected to the output terminal V and an input terminal P2, respectively, and the emitter electrode and the collector electrode of the semiconductor chip 78-6 may be electrically connected to the output terminal W and an input terminal P3, respectively.

Each of the semiconductor chips 78-1 to 78-6 may be alternately switched on and off by the signal input into the control electrode pads of the semiconductor chips 78. Each semiconductor chip 78 in the present example may generate heat at the time of switching. The input terminals P1, P2, and P3 may be connected to the positive terminal of the external power source, the input terminals N1, N2, and N3 to the negative terminal of the external power source, and the output terminals U, V, and W to a load, respectively. The input terminals P1, P2, and P3 may be electrically connected to each other, and the other input terminals N1, N2, and N3 may be also electrically connected to each other.

The plurality of semiconductor chips 78-1 to 78-6 of the semiconductor module 100 may each be an RC-IGBT (Reverse Conducting IGBT) semiconductor chip. In the RC-IGBT semiconductor chip, an IGBT and a free wheeling diode (FWD) are integrally formed, and the IGBT and the FWD may be connected in inverse parallel. The plurality of semiconductor chips 78-1 to 78-6 may each include a combination of a transistor such as MOSFET or IGBT and a diode. The chip substrates for the transistor and the diode may be a silicon substrate, a silicon carbide substrate, or a gallium nitride substrate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A cooling apparatus for a semiconductor module including a semiconductor chip, comprising:
    a ceiling plate having a lower surface;
    a casing portion including a coolant circulation portion and an outer edge portion surrounding the coolant circulation portion, the coolant circulation portion being arranged to face the lower surface of the ceiling plate, and the casing portion being closely attached, directly or indirectly, to the lower surface of the ceiling plate at the outer edge portion; and
    a cooling fin arranged in the coolant circulation portion, wherein
        the ceiling plate and the casing portion have a fastening portion in which the ceiling plate and the outer edge portion are stacked, and the fastening portion fastens the ceiling plate and the casing portion to an external device, and
        the cooling apparatus further comprises a reinforcing member provided between the ceiling plate and the outer edge portion at the fastening portion.

2. The cooling apparatus according to claim 1, wherein the fastening portion protrudes toward an outside of a perimeter of the ceiling plate at the perimeter.

3. The cooling apparatus according to claim 2, wherein the ceiling plate has two sets of facing sides and four corners when viewed from above,
    the fastening portion is provided so as to protrude toward the outside of the perimeter of the ceiling plate at at least one of the corners,
    the casing portion includes a base plate having four corners, the coolant circulation portion is arranged between the base plate and the lower surface of the ceiling plate, and an opening connecting the coolant circulation portion with an outside is provided at at least one of the corners of the base plate, and
    the corner of the ceiling plate at which the fastening portion is provided and the corner of the base plate at which the opening is provided are positioned to face each other.

4. The cooling apparatus according to claim 3, wherein the ceiling plate has a set of facing long sides and a set of facing short sides when viewed from above,
    the fastening portion is provided at both of a first corner at which the opening is provided and a second corner at which the opening is not provided, and
    a first fastening portion at the first corner is provided so as to protrude in a direction parallel to the long sides, and a second fastening portion at the second corner is provided so as to protrude in a direction different from the direction in which the first fastening portion protrudes.

5. The cooling apparatus according to claim 1, wherein a plurality of reinforcing members, including the reinforcing member, are provided in a stacked manner in the fastening portion.

6. The cooling apparatus according to claim 1, wherein the ceiling plate has a side surface along a perimeter,
    the reinforcing member has an inner-side surface facing the coolant circulation portion and an outer-side surface opposite to the inner-side surface, and
    the outer-side surface of the reinforcing member is arranged so as to be flush with the side surface of the ceiling plate.

7. The cooling apparatus according to claim 1, wherein the reinforcing member is formed of a material having higher proof stress than materials of the ceiling plate and the casing portion.

8. The cooling apparatus according to claim 1, wherein a thickness of the casing portion at a position facing a center of the lower surface of the ceiling plate is the same as a thickness of the casing portion at the fastening portion.

9. The cooling apparatus according to claim 1, wherein the reinforcing member, the ceiling plate, and the casing portion have the same thickness at the fastening portion.

10. A semiconductor module, comprising:
    the cooling apparatus according to claim 1; and
    a semiconductor device arranged above the ceiling plate.

11. A vehicle comprising the semiconductor module according to claim 10.

12. A cooling apparatus for a semiconductor module including a semiconductor chip, comprising:
    a ceiling plate having an upper surface, on which the semiconductor chip is to be mounted, and a lower surface opposite to the upper surface;
    a reinforcing member arranged along a perimeter of the lower surface of the ceiling plate;
    a casing portion including a coolant circulation portion, the coolant circulation portion being arranged to face the lower surface of the ceiling plate;
    a cooling fin arranged in the coolant circulation portion; and
    a fastening portion, wherein
    the casing portion has a frame portion, a base plate, and a sidewall,
    the frame portion has an upper surface and a lower surface opposite to the upper surface, and the upper surface of the frame portion is closely attached, directly or indirectly, to the lower surface of the ceiling plate,
    the base plate has a corner and an opening provided at the corner, and the coolant circulation portion is arranged between the base plate and the lower surface of the ceiling plate, the sidewall connects an inner-side surface of the frame portion and a periphery of the base plate and defines the coolant circulation portion between the ceiling plate and the base plate, and the fastening portion is provided so as to protrude, at the perimeter of the ceiling plate, toward an outside away from the opening and the corner of the base plate, the frame portion, the reinforcing member, and the ceiling plate are stacked in this order in the fastening portion, and the fastening portion has a through hole penetrating the frame portion, the reinforcing member, and the ceiling plate.

13. The cooling apparatus according to claim 12, wherein a pipe is connected to the opening of the base plate of the casing portion, and the pipe protrudes away from the cooling fin.

14. A semiconductor module, comprising:
the cooling apparatus according to claim 12; and
a semiconductor device arranged above the ceiling plate.

15. A vehicle comprising the semiconductor module according to claim 14.

* * * * *